(12) United States Patent
Ho et al.

(10) Patent No.: US 10,734,704 B2
(45) Date of Patent: Aug. 4, 2020

(54) ANTENNA PACKAGE AND METHOD OF MANUFACTURING THE SAME

(71) Applicant: Advanced Semiconductor Engineering, Inc., Kaohsiung (TW)

(72) Inventors: Cheng-Lin Ho, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 66 days.

(21) Appl. No.: 16/197,352

(22) Filed: Nov. 20, 2018

(65) Prior Publication Data
US 2020/0161743 A1    May 21, 2020

(51) Int. Cl.
| | |
|---|---|
| *H01Q 1/22* | (2006.01) |
| *H01Q 23/00* | (2006.01) |
| *H01Q 9/04* | (2006.01) |
| *H01Q 21/06* | (2006.01) |
| *H01L 23/66* | (2006.01) |
| *H01Q 21/00* | (2006.01) |
| *H01L 23/00* | (2006.01) |

(52) U.S. Cl.
CPC ........... *H01Q 1/2283* (2013.01); *H01L 23/66* (2013.01); *H01L 24/48* (2013.01); *H01Q 9/0407* (2013.01); *H01Q 21/0087* (2013.01); *H01Q 21/065* (2013.01); *H01Q 23/00* (2013.01); *H01L 2223/6677* (2013.01); *H01L 2924/1811* (2013.01); *H01L 2924/1815* (2013.01)

(58) Field of Classification Search
CPC ...... H01Q 1/22; H01Q 1/2283; H01Q 9/0407; H01Q 21/0087; H01Q 21/065; H01Q 23/00
See application file for complete search history.

(56) References Cited

U.S. PATENT DOCUMENTS

| | | | | |
|---|---|---|---|---|
| 6,818,985 | B1 * | 11/2004 | Coccioli | ............. H01L 23/3128 257/240 |
| 7,928,910 | B2 | 4/2011 | Suzuki et al. | |
| 2013/0292808 | A1 * | 11/2013 | Yen | ........................ H01L 23/552 257/660 |
| 2016/0056544 | A1 * | 2/2016 | Garcia | ................... H01Q 23/00 343/725 |
| 2016/0381784 | A1 | 12/2016 | Miura | |
| 2017/0194271 | A1 * | 7/2017 | Hsu | ..................... H01L 23/3128 |
| 2017/0236776 | A1 * | 8/2017 | Huynh | ................ H01L 23/3677 257/428 |

FOREIGN PATENT DOCUMENTS

| | | | |
|---|---|---|---|
| JP | 2003-0198248 A | 7/2003 | |
| JP | WO2012081288 A1 * | 6/2012 | ............. H01Q 23/00 |
| KR | 10-1151254 B1 | 6/2012 | |

* cited by examiner

*Primary Examiner* — Hoang V Nguyen
(74) *Attorney, Agent, or Firm* — Foley & Lardner LLP

(57) ABSTRACT

An antenna package includes a patterned antenna structure and an encapsulant. The patterned antenna structure includes a first surface, a second surface opposite the first surface and a third surface extended between the first surface and the second surface. The encapsulant is disposed on the first surface of the patterned antenna structure. The third surface of the patterned antenna structure includes a first portion covered by the encapsulant and a second portion exposed from the encapsulant.

21 Claims, 17 Drawing Sheets

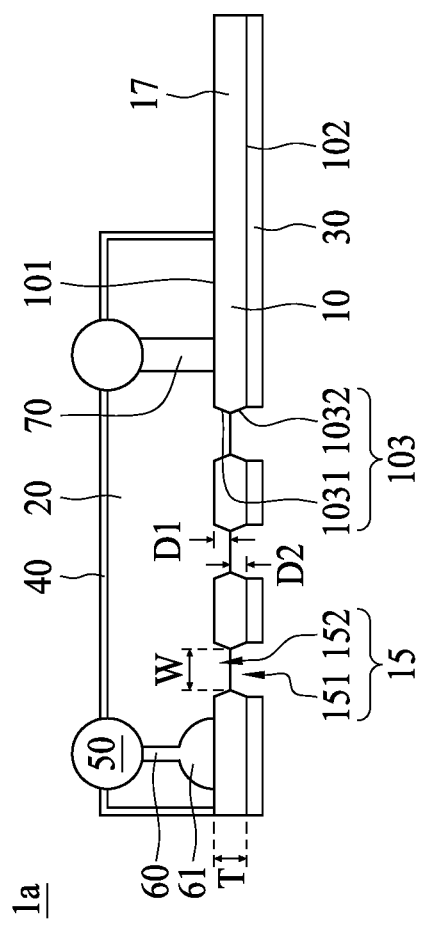
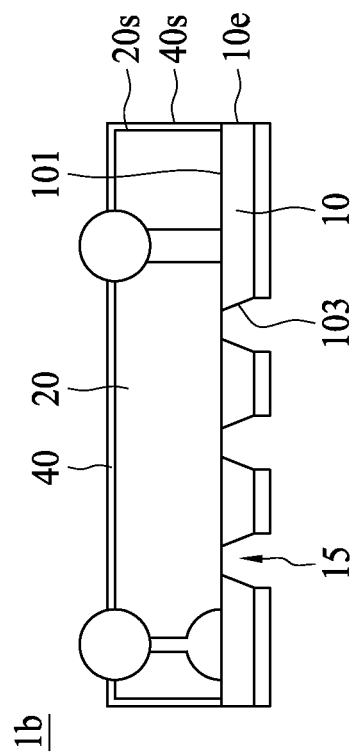
Fig. 1A
Fig. 1B

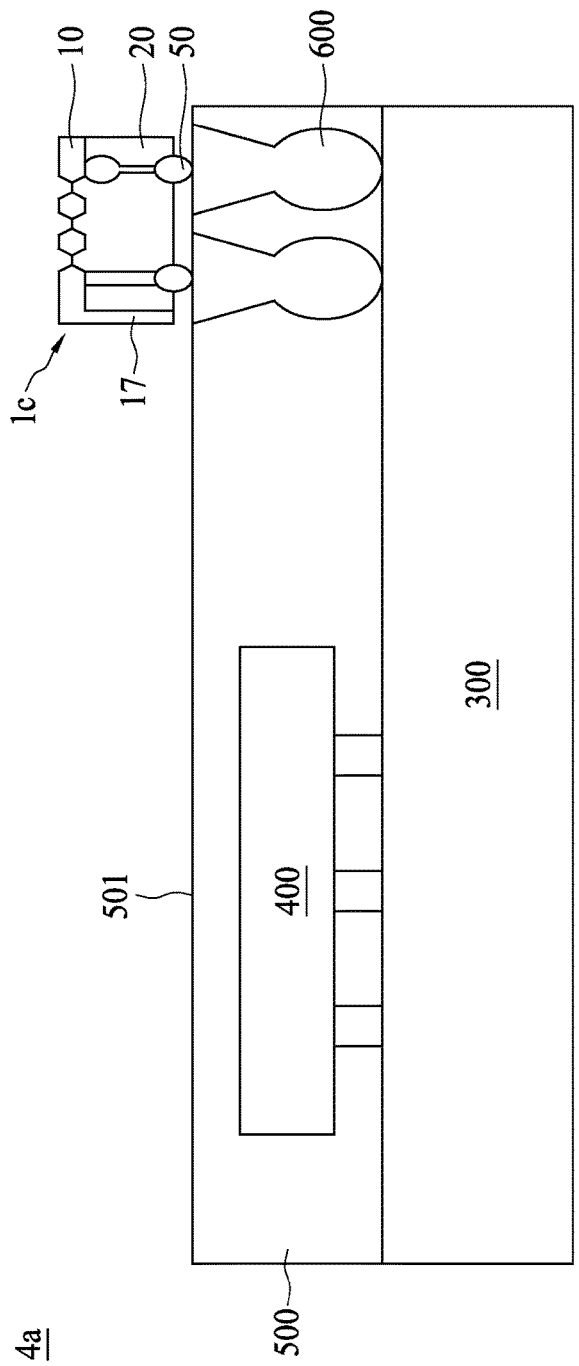
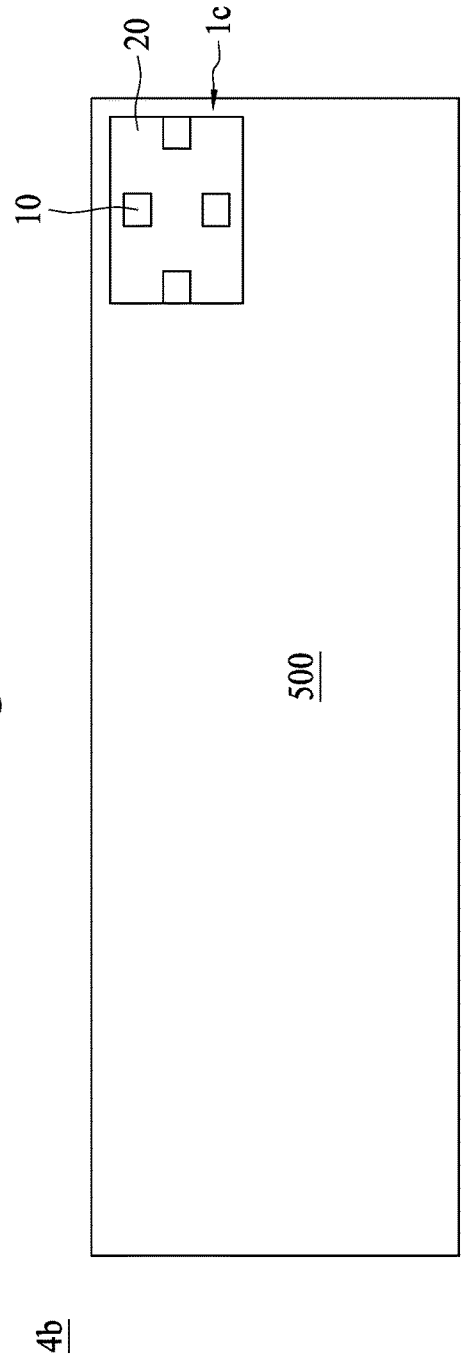

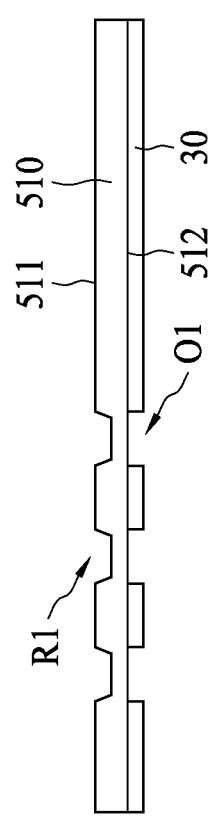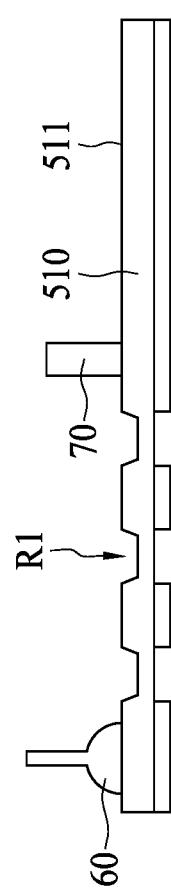

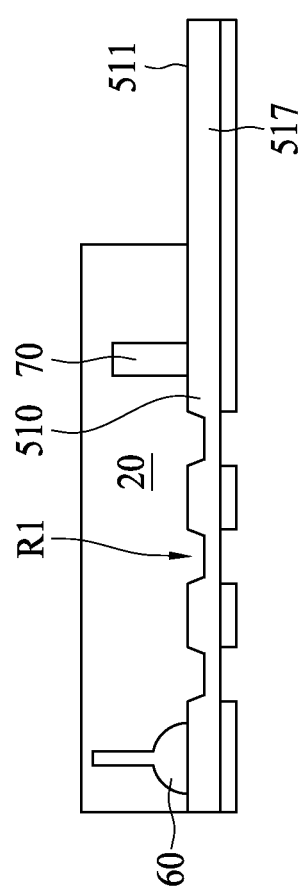
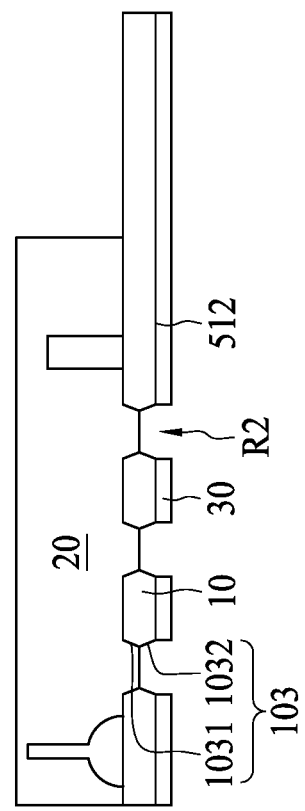

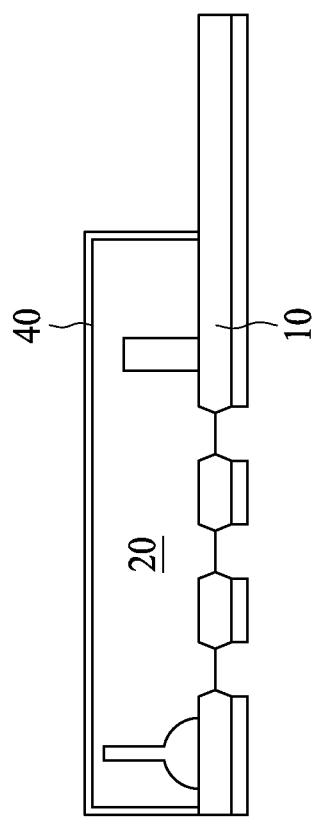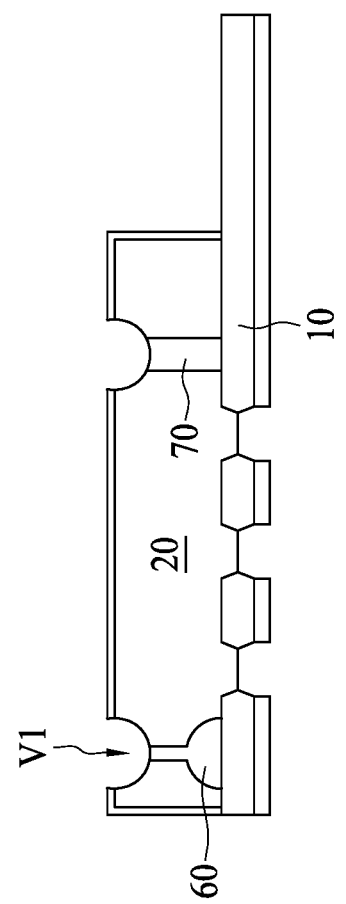

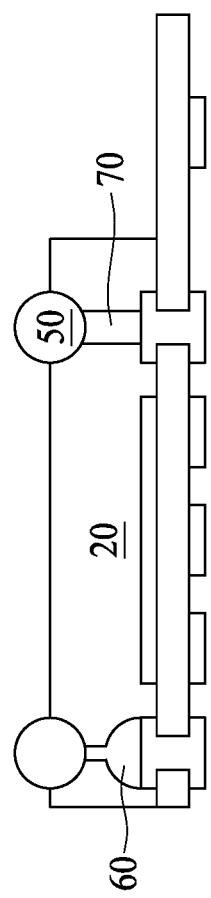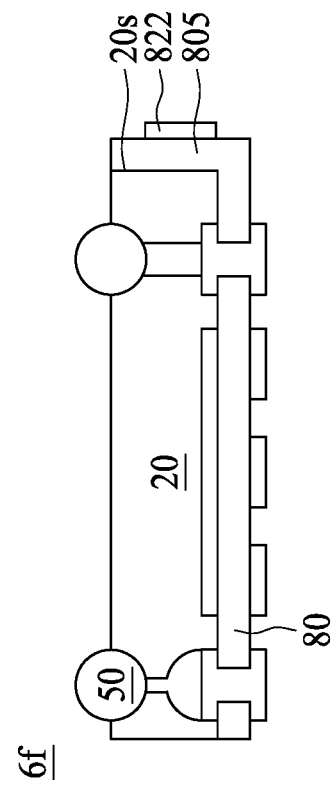

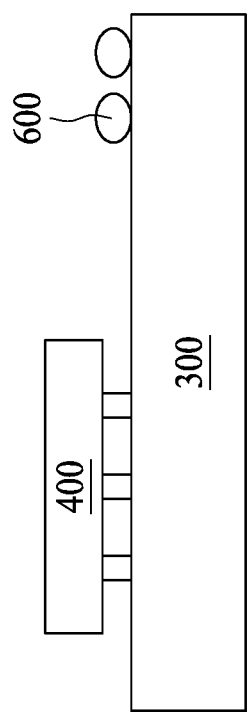
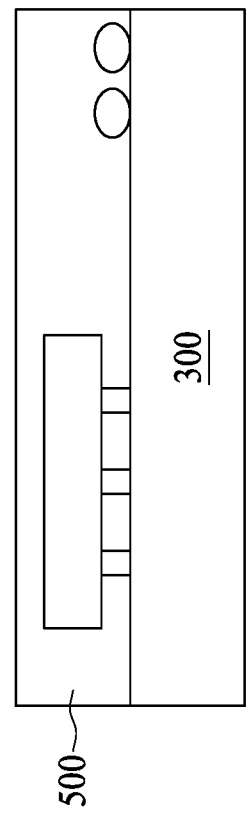

_US 10,734,704 B2_

ANTENNA PACKAGE AND METHOD OF MANUFACTURING THE SAME

BACKGROUND

1. Technical Field

The present disclosure relates generally to an antenna package, and more particularly, an antenna package including a patterned antenna structure and a method of manufacturing the same.

2. Description of the Related Art

Chip antennas are used as the antenna structure for IC packages. In manufacturing a chip antenna, plating or sputtering operations are often utilized to form the antenna pattern on a substrate, dielectric material, or molding compound. However, to obtain an antenna pattern with a sufficient thickness for various applications, plating or sputtering operations may not be efficient in terms of time or cost.

SUMMARY

In one aspect, according to some embodiments, an antenna package includes a patterned antenna structure and an encapsulant. The patterned antenna structure includes a first surface, a second surface opposite the first surface and a third surface extended between the first surface and the second surface. The encapsulant is disposed on the first surface of the patterned antenna structure. The third surface of the patterned antenna structure includes a first portion covered by the encapsulant and a second portion exposed from the encapsulant.

In another aspect, according to some embodiments, a semiconductor package includes a substrate, a semiconductor die, and an antenna package. The semiconductor die is disposed on the substrate and electrically connected to the substrate. The antenna package is disposed on the substrate and electrically connected to the substrate. The antenna package includes an encapsulant and a patterned antenna structure. The patterned antenna structure is disposed on the encapsulant. The patterned antenna structure of the antenna package includes a metal extension part extending between the encapsulant of the antenna package and the semiconductor die.

In yet another aspect, according to some embodiments, a method of manufacturing an antenna package includes providing a metal plate having a first surface and a second surface opposite to the first surface, forming a first patterned recess on the first surface of the metal plate, forming an encapsulant on the first surface of the metal plate and into the first patterned recess, and forming a second patterned recess on the second surface of the metal plate and connecting to the first patterned recess to define a first antenna pattern. The first antenna pattern protrudes into the encapsulant in a direction away from the second surface of the metal plate.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

FIG. 1A illustrates a cross-sectional view of an antenna package in accordance with some embodiments of the present disclosure.

FIG. 1B illustrates a cross-sectional view of an antenna package in accordance with some embodiments of the present disclosure.

FIG. 4A illustrates a cross-sectional view of a semiconductor package in accordance with some embodiments of the present disclosure.

FIG. 4B illustrates a top view of a semiconductor package in accordance with some embodiments of the present disclosure.

FIG. 5A, FIG. 5B, FIG. 5C, FIG. 5D, FIG. 5E, FIG. 5F, FIG. 5G and FIG. 5H are cross-sectional views of an antenna package fabricated at various stages, in accordance with some embodiments of the present disclosure.

FIG. 6A, FIG. 6B, FIG. 6C, FIG. 6D, FIG. 6E and FIG. 6F are cross-sectional views of an antenna package fabricated at various stages, in accordance with some embodiments of the present disclosure.

FIG. 7A, FIG. 7B, FIG. 7C, FIG. 7D and FIG. 7E are cross-sectional views of a semiconductor package fabricated at various stages, in accordance with some embodiments of the present disclosure.

Common reference numerals are used throughout the drawings and the detailed description to indicate the same or similar elements. The present disclosure will be more readily understood from the following detailed description taken in conjunction with the accompanying drawings.

DETAILED DESCRIPTION

Figure 1C:
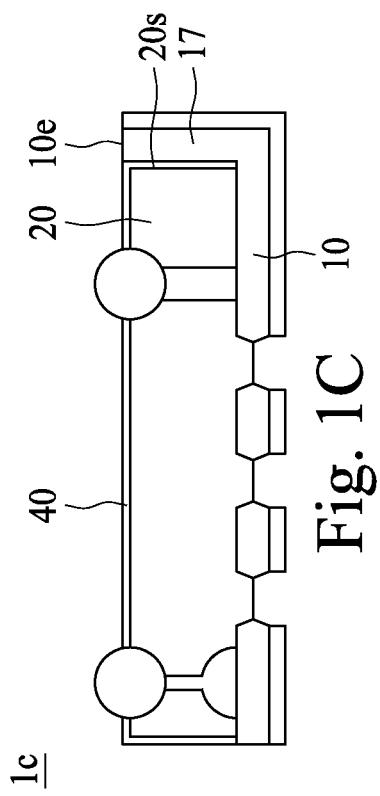
FIG. 1C illustrates a cross-sectional view of an antenna package in accordance with some embodiments of the present disclosure.

According to some embodiments of the present disclosure as to manufacturing an antenna package, by forming a molding compound on a lead frame or metal structure formed with an antenna pattern, the thickness of the antenna pattern exposed from the molding compound can be well controlled to improve the signal transmission, and the manufacturing of the antenna package can be more efficient and cost-effective.

FIG. 1A illustrates a cross-sectional view of an antenna package 1a in accordance with some embodiments of the present disclosure. The antenna package 1a includes a patterned antenna structure 10, an encapsulant 20, a conductive layer 30, a shielding layer 40, an electrical contact 50 and conductive elements 60 and 70.

The patterned antenna structure 10 includes a surface 101, a surface 102 opposite to the surface 101 and a surface 103 extended between the surface 101 and the surface 102. In some embodiments, the surface 103 includes a portion 1031 and a portion 1032 connected to the portion 1031. In some embodiments, the portion 1031 and the portion 1032 of the surface 103 are not coplanar. For example, the portion 1031 and the portion 1032 define an angle less than 180 degrees. The patterned antenna structure 10 may include, may be or may be made of a metal plate. The patterned antenna structure 10 may include, may be or may be made of a lead frame. The patterned antenna structure 10 may include, for example, aluminum (Al), copper (Cu), chromium (Cr), tin (Sn), gold (Au), silver (Ag), nickel (Ni) or stainless steel, or a mixture, an alloy, or other combination thereof.

The conductive elements 60 and 70 are disposed on the surface 101 of the patterned antenna structure 10. The conductive element 60 and/or the conductive element 70 may include Al, Cu, Cr, Sn, Au, Ag, N) or stainless steel, or a mixture, an alloy, or other combination thereof. In some embodiments, the conductive element 60 may be a conductive wire and may have a bump portion 61 in contact with the patterned antenna structure 10. In some embodiments, the conductive element 70 may have a pin or pillar structure.

The electrical contacts 50 are disposed on the conductive elements 60 and 70. The electrical contacts 50 are electrically connected to the patterned antenna structure 10 through the conductive elements 60 and 70. The electrical contacts 50 may include solder. The electrical contact 50 may provide electrical connection for the patterned antenna structure 10 to external devices.

The encapsulant 20 is disposed on the surface 101 of the patterned antenna structure 10. The encapsulant 20 covers the surface 101 of the patterned antenna structure 10, the conductive elements 60 and 70 and a portion of the electrical contacts 50. In some embodiments, the encapsulant 20 covers the portion 1031 of the surface 103 of the patterned antenna structure 10 and exposes the portion 1032 of the surface 103 of the patterned antenna structure 10. The encapsulant 20 may include an epoxy resin having fillers, a molding compound (e.g., an epoxy molding compound or other molding compound), a polyimide, a phenolic compound or material, a material with a silicone dispersed therein, or a combination thereof.

The surface 103 of the patterned antenna structure 10 defines a space 15. A portion of the encapsulant 20 is exposed by the space 15. For example, a portion of a bottom surface of the encapsulant 20 is exposed from the space 15. The encapsulant 20 is disposed into a portion of the space 15. In some embodiments, a ratio of a width W of the space 15 to a thickness T of the patterned antenna structure 10 is less than 1. The ratio configuration may facilitate some patterning operations, such as an etching operation, during manufacturing of the antenna package 1a. The ratio configuration may reduce deformation of the patterned antenna structure 10 during manufacturing of the antenna package 1a.

The space 15 includes a portion 151 and a portion 152. The portion 151 is defined by the portion 1031 of the surface 103 of the patterned antenna structure 10. The portion 152 is defined by the portion 1032 of the surface 103 of the patterned antenna structure 10. The portion 151 and the portion 152 may have a tapered shape. The portion 151 of the space 15 is tapered in a direction from the surface 102 of the patterned antenna structure 10 into the patterned antenna structure 10. The portion 152 of the space 15 is tapered in a direction from the surface 101 of the patterned antenna structure 10 into the patterned antenna structure 10. In some embodiments, a depth D1 of the portion 151 of the space 15 is less than a depth D2 of the portion 152 of the space 15. In some embodiments, a ratio of the depth D1 of the portion 151 of the space 15 to the thickness T of the patterned antenna structure 10 is greater than 0 and less than about 0.5. The depth configuration may increase the portion (or depth) of the patterned antenna structure 10 exposed from the encapsulant 20. The depth configuration may increase the radiation (such as radiation in a lateral direction) efficiency of the antenna package.

In FIG. 1A, the patterned antenna structure 10 includes an extended portion 17. The extended portion 17 may include an antenna pattern. The antenna pattern on the extended portion 17 may function to adjust the total radiation pattern for the antenna package 1a.

The conductive layer 30 is disposed on the surface 102 of the patterned antenna structure 10. In some embodiments, an electrical conductivity of the conductive layer 30 is greater than an electrical conductivity of the patterned antenna structure 10. The conductive layer 30 may include Ni, Au or an alloy thereof. The configuration of the conductive layer 30 may improve the conductive, radiation, or transmission efficiency of the antenna package 1a. The configuration of the conductive layer 30 may result in better skin effect for the antenna package 1a, which increases the performance of the antenna package 1a.

The shielding layer 40 is disposed on the encapsulant 20. The shielding layer 40 may be disposed conformally on the encapsulant 20. The shielding layer 40 covers the encapsulant 20. The shielding layer 40 is insulated from the electrical contacts 50. In some embodiments, the shielding layer 40 is a conductive thin film, and may include, for example, Al, Cu, Cr, Sn, Au, Ag, Ni or stainless steel, or a mixture, an alloy, or other combination thereof. The shielding layer 40 can be used to reduce or eliminate electromagnetic interference (EMI) between the antenna package 1a and other devices.

FIG. 1B illustrates a cross-sectional view of an antenna package 1b in accordance with some embodiments of the present disclosure. The antenna package 1b is similar to the antenna package 1a in FIG. 1A with some differences described below.

The patterned antenna structure 10 of the antenna package 1b does not have the extended portion 17. An end 10e of the patterned antenna structure 10 is coplanar with a sidewall 20s of the encapsulant 20 or is coplanar with a sidewall 40s of the shielding layer 40. The surface 103 of the patterned antenna structure 10 is fully exposed from the encapsulant 20. The encapsulant 20 is not disposed into the space 15. The portion (or depth) of the patterned antenna structure 10 exposed from the encapsulant 20 in the antenna package 1b may be greater than the portion (or depth) of the patterned antenna structure 10 exposed from the encapsulant 20 in the antenna package 1a. The antenna package 1b may have a better radiation efficiency (e.g., in a lateral direction) than the antenna package 1a.

FIG. 1C illustrates a cross-sectional view of an antenna package 1c in accordance with some embodiments of the present disclosure. The antenna package 1c is similar to the antenna package 1a in FIG. 1A with some differences described below.

The extended portion 17 of the patterned antenna structure 10 is inclined toward or bent toward the encapsulant 20. The extended portion 17 may be in contact with the encapsulant 20 or the shielding layer 40. In the embodiment shown in FIG. 1C, the extended portion 17 extends along the sidewall 20s of the encapsulant 20. The end 10e of the patterned antenna structure 10 may be coplanar with a top surface of the encapsulant 20 or may be coplanar with a top surface of the shielding layer 40. In some embodiments, the extended portion 17 functions as a 3D antenna. In some embodiments, the extended portion 17 includes a metal plate and may reduce or eliminate EMI between the antenna package 1c and other devices.

Figure 2A:
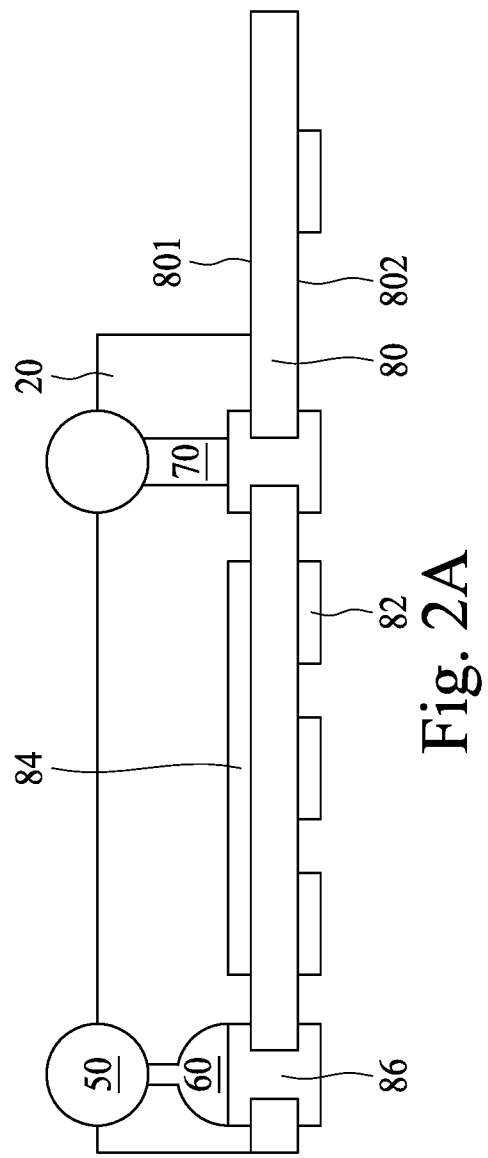
FIG. 2A illustrates a cross-sectional view of an antenna package in accordance with some embodiments of the present disclosure.

FIG. 2A illustrates a cross-sectional view of an antenna package 2a in accordance with some embodiments of the present disclosure. The antenna package 2a includes a substrate 80, an encapsulant 20, an electrical contact 50 and conductive elements 60 and 70. In some embodiments, the antenna package 2a is similar to the antenna package 1a in FIG. 1A except that, the conductive layer 30 and the shielding layer 40 of the antenna package 1a are omitted, and the patterned antenna structure 10 of the antenna package 1a is replaced by the substrate 80.

The substrate 80 may be or may include a printed circuit, e.g., a flexible printed circuit (FPC). The substrate 80 includes an antenna array (or an antenna pattern) 82 and a shielding layer 84. The antenna array 82 is disposed on a surface 802 of the substrate 80. The antenna array 82 may have the same or similar properties or functions as the patterned antenna structure 10 of the antenna package 1a in FIG. 1A. The antenna array 82 may be electrically connected to the electrical contacts 50 through conductors 86 within the substrate 80 and the conductive elements 60 and 70. The shielding layer 84 is disposed on a surface 801 of the substrate 80. The shielding layer 84 may have the same or similar properties or functions as the shielding layer 40 of the antenna package 1a in FIG. 1A. The shielding layer 84 may reduce or eliminate EMI between the antenna array 82 and other electrical components within or outside the antenna package 2a.

Figure 2B:
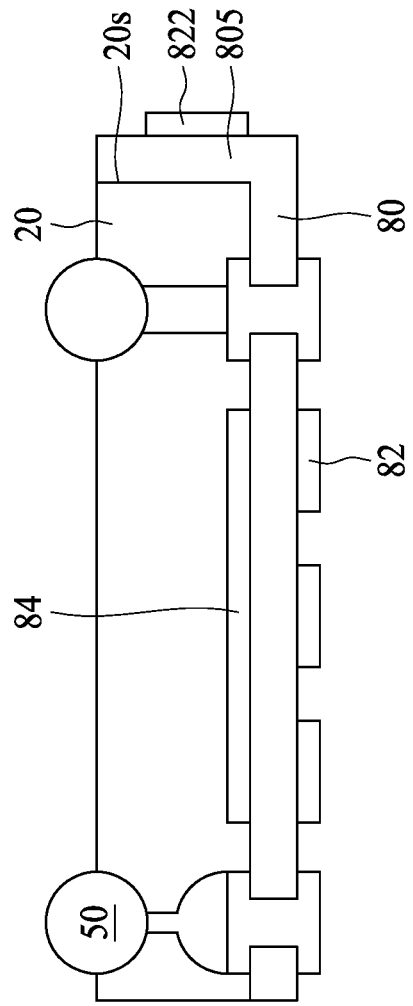
FIG. 2B illustrates a cross-sectional view of an antenna package in accordance with some embodiments of the present disclosure.

FIG. 2B illustrates a cross-sectional view of an antenna package 2b in accordance with some embodiments of the present disclosure. The antenna package 2b is similar to the antenna package 2a in FIG. 2A with some differences described below.

An extended portion 805 of the substrate 80 is inclined toward or bent toward the encapsulant 20. The extended portion 805 may be in contact with a sidewall 20s of the encapsulant 20. The extended portion 805 includes an antenna array 822. The antenna array 822 may function as a 3D antenna.

Figure 2C:
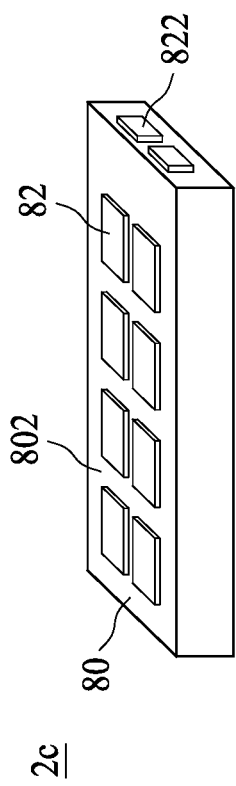
FIG. 2C illustrates a perspective view of an antenna package in accordance with some embodiments of the present disclosure.

FIG. 2C illustrates a perspective view of an antenna package 2c in accordance with some embodiments of the present disclosure. The antenna package 2c is similar to the antenna package 2b in FIG. 2B. As shown in FIG. 2C, the antenna array 82 is disposed on a surface 802 of the substrate (e.g., an FPC) 80. The antenna array 822 is disposed on a lateral side of the antenna package 2c.

Figure 3A:
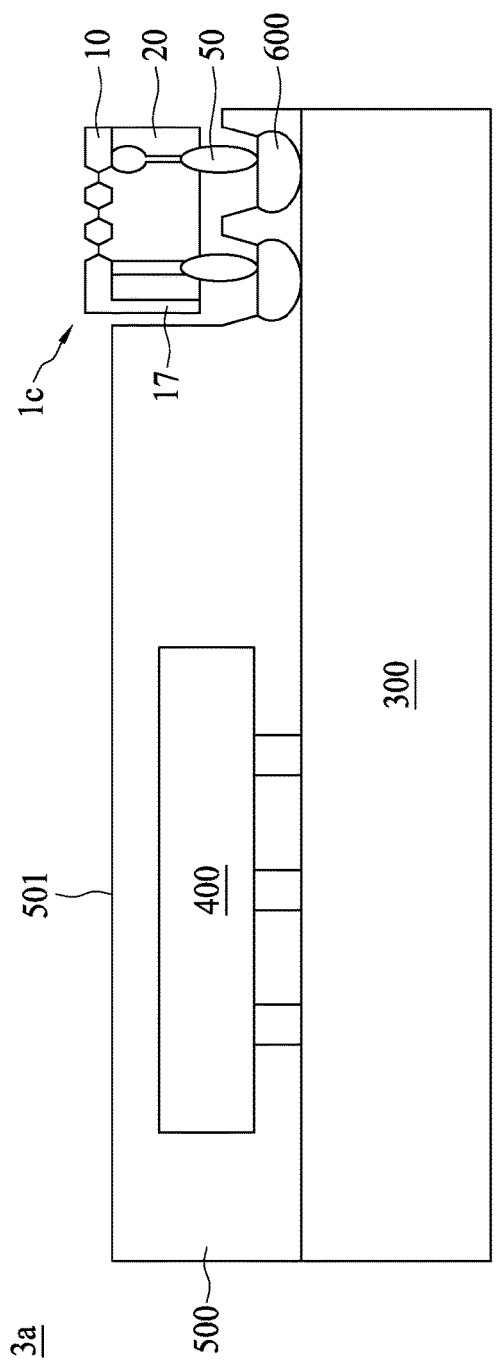
FIG. 3A illustrates a cross-sectional view of a semiconductor package in accordance with some embodiments of the present disclosure.

FIG. 3A illustrates a cross-sectional view of a semiconductor package 3a in accordance with some embodiments of the present disclosure. The semiconductor package 3a includes a substrate 300, a semiconductor die 400, a package body 500 and an antenna package 1c.

The substrate 300 may include, for example, a printed circuit board, such as a paper-based copper foil laminate, a composite copper foil laminate, or a polymer-impregnated glass-fiber-based copper foil laminate. The substrate 300 may include an interconnection structure, such as a redistribution layer (RDL) or a grounding element.

The semiconductor die 400 is disposed on the substrate 300 and is electrically connected to the substrate 300. The semiconductor die 400 may be mounted on the substrate 300 through a die bonding operation, a flip chip bonding operation or any suitable operation. The semiconductor die 400 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The package body 500 is disposed on the substrate 300. The package body 500 covers the substrate 300. The package body 500 covers the semiconductor die 400. The semiconductor die 400 is embedded in the package body 500. In some embodiments, the package body 500 includes an epoxy resin having fillers, a molding compound (e.g., an epoxy molding compound or other molding compound), a polyimide, a phenolic compound or material, a material with a silicone dispersed therein, or a combination thereof.

The antenna package 1c is the same as or similar to the antenna package 1c described in FIG. 1C, and includes a patterned antenna structure 10, an encapsulant 20 and electrical contacts 50. The patterned antenna structure 10 is disposed on the encapsulant 20. The antenna package 1c is disposed on the substrate 300 and electrically connected to the substrate 300. In the embodiment shown in FIG. 3A, the antenna package 1c is electrically connected to the substrate 300 through the connection between the electrical contacts 50 of the antenna package 1c and conductive elements 600. The conductive elements 600 are surrounded or covered by the package body 500, and are electrically connected to the substrate 300.

The patterned antenna structure 10 of the antenna package 1c includes an extended portion 17, which may be a metal extension part. The extended portion 17 extends between the encapsulant 20 of the antenna package 1c and the semiconductor die 400. The extended portion 17 may include a shielding layer. The extended portion 17 may reduce or eliminate EMI between the antenna package 1c and the semiconductor die 400. The extended portion 17 may reduce or eliminate EMI between the patterned antenna structure 10 of the antenna package 1c and the semiconductor die 400.

As shown in FIG. 3A, the antenna package 1c is exposed from the package body 500. The antenna package 1c is disposed in a recess recessed from a surface 501 of the package body 500. The patterned antenna structure 10 may be disposed higher than the surface 501 of the package body 500.

Figure 3B:
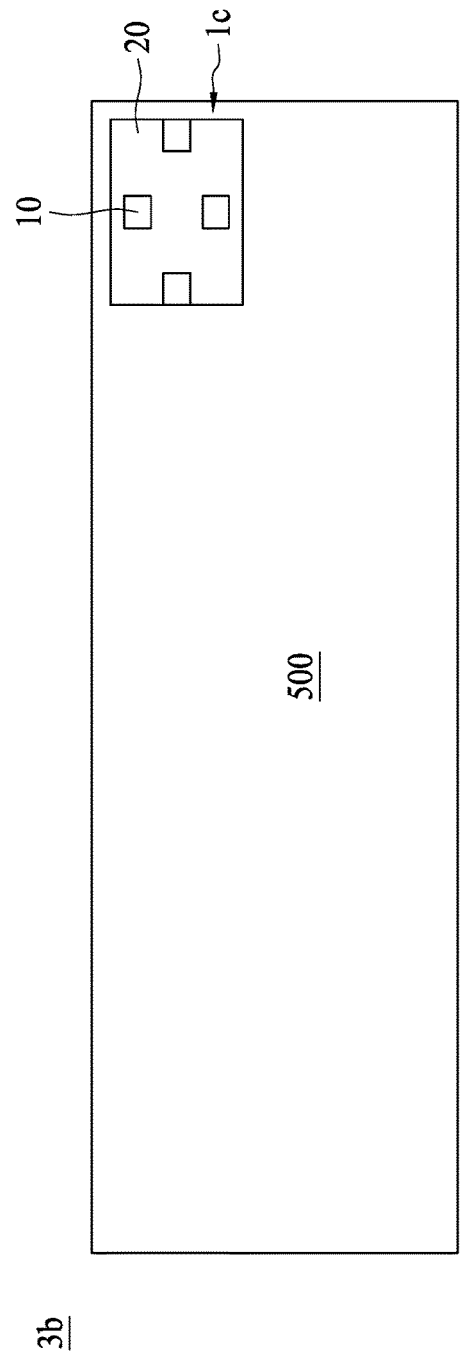
FIG. 3B illustrates a top view of a semiconductor package in accordance with some embodiments of the present disclosure.

FIG. 3B illustrates a top view of a semiconductor package 3b in accordance with some embodiments of the present disclosure. An example of a pattern of a patterned antenna structure 10 of an antenna package 1c is illustrated.

FIG. 4A illustrates a cross-sectional view of a semiconductor package 4a in accordance with some embodiments of the present disclosure. The semiconductor package 4a is similar to the semiconductor package 3a in FIG. 3A with some differences described below.

The antenna package 1c is disposed on the surface 501 of the package body 500. The antenna package 1c may be fully above the surface 501 of the package body 500. The extended portion 17 may include an antenna pattern. The extended portion 17 may function as a 3D antenna.

FIG. 4B illustrates a top view of a semiconductor package 4b in accordance with some embodiments of the present disclosure. An example of a pattern of a patterned antenna structure 10 of an antenna package 1c is illustrated.

FIG. 5A, FIG. 5B, FIG. 5C, FIG. 5D, FIG. 5E, FIG. 5F, FIG. 5G and FIG. 5H are cross-sectional views of an antenna package 5h fabricated at various stages, in accordance with some embodiments of the present disclosure. Various figures have been simplified for a better understanding of the aspects of the present disclosure.

Referring to FIG. 5A, a metal plate (which may be a lead frame or a portion of the lead frame) 510 is provided. The metal plate 510 has a surface 511 and a surface 512 opposite to the surface 511. A patterned recess R1 is formed on the surface 511 of the metal plate 510. The patterned recess R1 may be formed by an etching operation such as a half etching operation. In some embodiments, a depth of the patterned recess R1 is less than half of a thickness of the metal plate 510. A conductive layer 30 may be formed on the surface 512 of the metal plate 510. The conductive layer 30 has openings O1 exposing portions of the surface 512 corresponding to the patterned recess R1. An electrical conductivity of the conductive layer 30 may be greater than an electrical conductivity of the metal plate 510.

Referring to FIG. 5B, conductive elements 60 and 70 are formed on the surface 511 of the metal plate 510. The conductive element 60 may be a conductive wire and may be formed by a wire bonding operation. The conductive element 70 may be a conductive pillar or a conductive pin (e.g., a copper pillar or a copper pin) and may be connected to the metal plate 510 by a solder.

Referring to FIG. 5C, an encapsulant 20 is formed on the surface 511 of the metal plate 510. The encapsulant 20 is formed into the patterned recess R1. A portion 517 of the metal plate 510 is not covered by the encapsulant 20. The encapsulant 20 may be formed by any suitable operation such as a selective molding operation or a dispensing operation.

Referring to FIG. 5D, a patterned recess R2 is formed on the surface 512 of the metal plate 510. The patterned recess R2 corresponds to the patterned recess R1. The patterned recess R2 is formed to be connected to the patterned recess R1 to define a patterned antenna structure 10 including a surface 103. The surface 103 includes a portion 1031 covered by the encapsulant 20 and a portion 1032 exposed from the encapsulant 20. The patterned antenna structure 10 protrudes into the encapsulant 20. The patterned recess R2 may be formed by an etching operation. The conductive layer 30 may be used as a stop layer during the etching operation.

Referring to FIG. 5E, a shielding layer 40 is formed on the encapsulant 20. The shielding layer 40 is formed to cover the encapsulant 20. The shielding layer 40 may be formed by a plating or a sputtering operation.

Referring to FIG. 5F, vias (or through mold vias, TMV) V1 are formed through the shielding layer 40 and into the encapsulant 20 to expose the conductive elements 60 and 70. The vias V1 may be formed by any suitable operation such as a drilling operation or an etching operation.

Figure 5G:
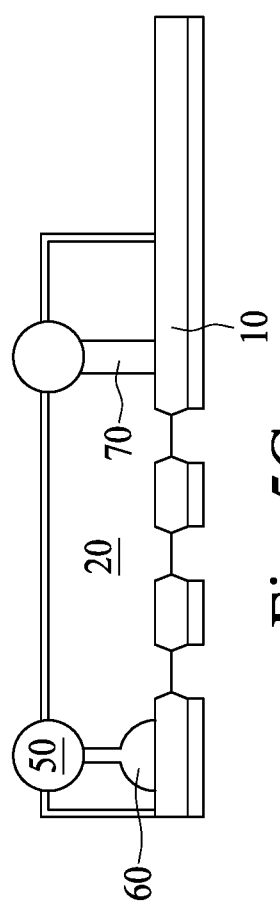

Referring to FIG. 5G, electrical contacts 50 are formed in the vias V1. The electrical contacts 50 are formed to be electrically connected to the conductive elements 60 and 70. The electrical contacts 50 may be formed to be electrically insulated from the shielding layer 40. The electrical contacts 50 may include solder and may be formed by any suitable operation such as a ball mount operation.

Figure 5H:
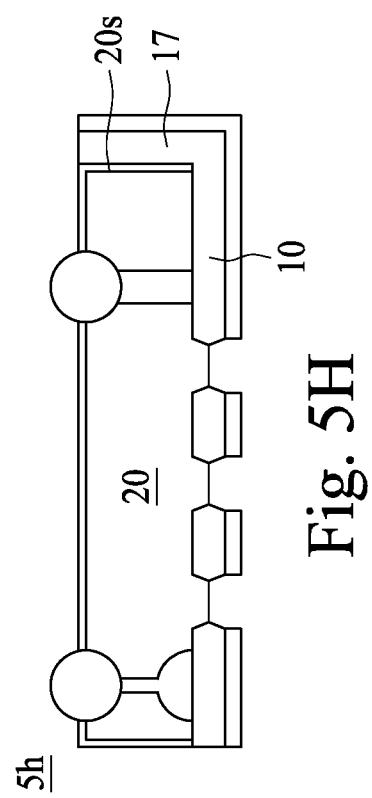

Referring to FIG. 5H, a portion 17 of the patterned antenna structure 10 that is not covered by the encapsulant 20 in FIG. 5G is bent toward the encapsulant 20. The portion 17 may be bent to be in contact with a sidewall 20s of the encapsulant 20. In some embodiments, an antenna pattern may be formed on the portion 17 by the etching operation in FIG. 5A, the etching operation in FIG. 5D, or by other operations. An antenna package 5h is formed. The antenna package 5h may be the same as or similar to the antenna package 1c in FIG. 1C.

FIG. 6A, FIG. 6B, FIG. 6C, FIG. 6D, FIG. 6E and FIG. 6F are cross-sectional views of an antenna package 6f fabricated at various stages, in accordance with some embodiments of the present disclosure. Various figures have been simplified for a better understanding of the aspects of the present disclosure.

Figure 6A:
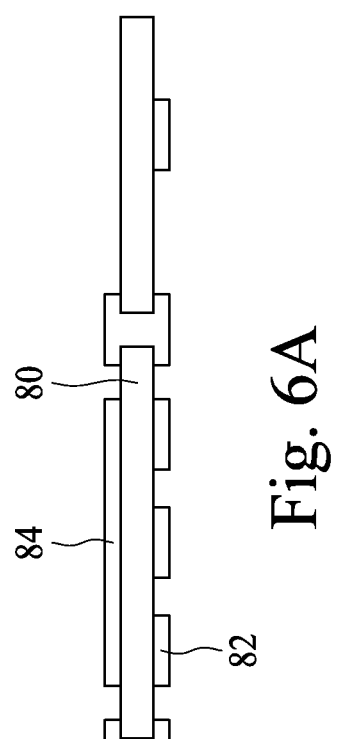

Referring to FIG. 6A, an FPC 80 is provided. The FPC 80 includes an antenna array 82, a shielding layer 84 and conductors 86. The FPC 80 may have similar properties as those of the substrate 80 described in FIG. 2A or FIG. 2B.

Figure 6B:
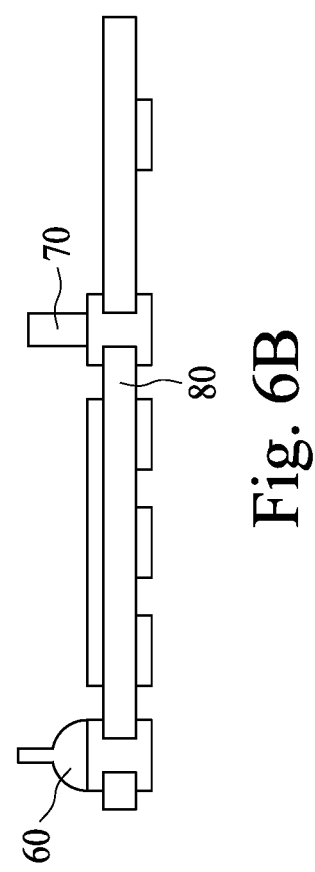

Referring to FIG. 6B, conductive elements 60 and 70 are formed on conductors 86 of the FPC 80. The conductive element 60 may be a conductive wire and may be formed by a wire bonding operation. The conductive element 70 may be a conductive pillar or a conductive pin (e.g., a copper pillar or a copper pin) and may be connected to the conductor 86 by a solder.

Figure 6C:
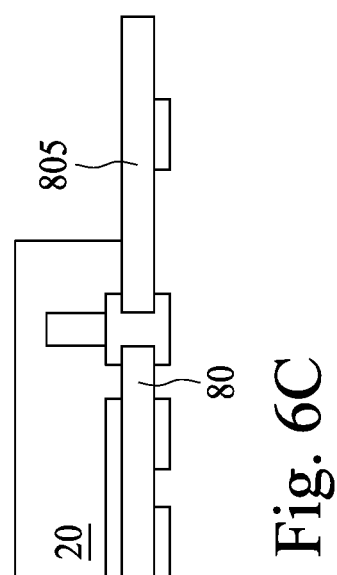

Referring to FIG. 6C, an encapsulant 20 is formed on the FPC 80. The encapsulant 20 is formed to cover the shielding layer 84 and the conductive elements 60 and 70. A portion 805 of the FPC 80 is not covered by the encapsulant 20. The encapsulant 20 may be formed by any suitable operation such as a selective molding operation or a dispensing operation.

Figure 6D:
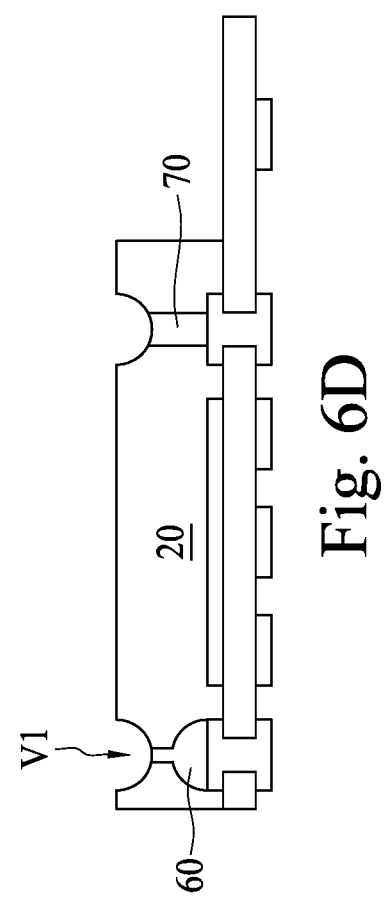

Referring to FIG. 6D, vias (or through mold vias, TMV) V1 are formed into the encapsulant 20 to expose the conductive elements 60 and 70. The vias V1 may be formed by any suitable operation such as a drilling operation or an etching operation.

Referring to FIG. 6E, electrical contacts 50 are formed in the vias V1. The electrical contacts 50 are formed to be electrically connected to the conductive elements 60 and 70. The electrical contacts 50 may include solder and may be formed by any suitable operation such as a ball mount operation.

Referring to FIG. 6F, the portion 805 of the FPC 80 is bent toward the encapsulant 20. The portion 805 may be bent to be in contact with a sidewall 20s of the encapsulant 20. An antenna pattern may be formed on the portion 805. The antenna package 6f is formed. The antenna package 6f may be the same as or similar to the antenna package 2b in FIG. 2B.

FIG. 7A, FIG. 7B, FIG. 7C, FIG. 7D and FIG. 7E are cross-sectional views of a semiconductor package 7e fabricated at various stages, in accordance with some embodiments of the present disclosure. Various figures have been simplified for a better understanding of the aspects of the present disclosure.

Referring to FIG. 7A, a substrate 300 is provided. A semiconductor die 400 is mounted on the substrate 300. The semiconductor die 400 may be mounted by a flip chip bonding operation, a die bonding operation or a die attach film (DAF) bonding operation. Conductive elements 600 are disposed on the substrate 300 to be electrically connected to the substrate 300. The conductive elements 600 may include solder and may be disposed by a ball mount operation.

Referring to FIG. 7B, a package body 500 is formed on the substrate 300 to cover the semiconductor die 400 and the conductive elements 600. The package body 500 may be formed by a molding operation.

Figure 7C:
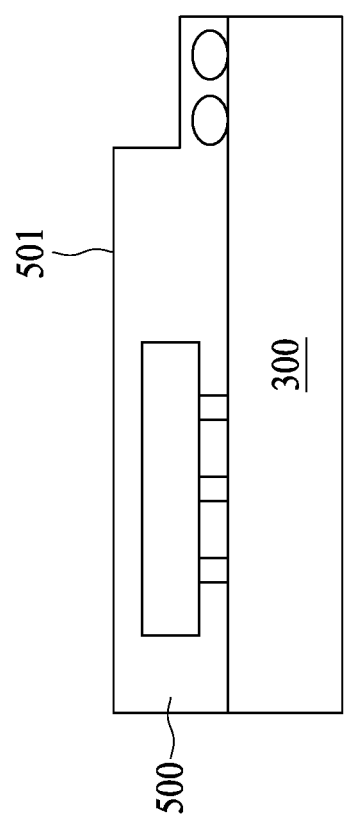

Referring to FIG. 7C, a portion of the package body 500 is removed to form a recess recessed from a surface 501 of the package body 500. The removing operation may be performed by a half cut operation, a drilling operation or an etching operation.

Figure 7D:
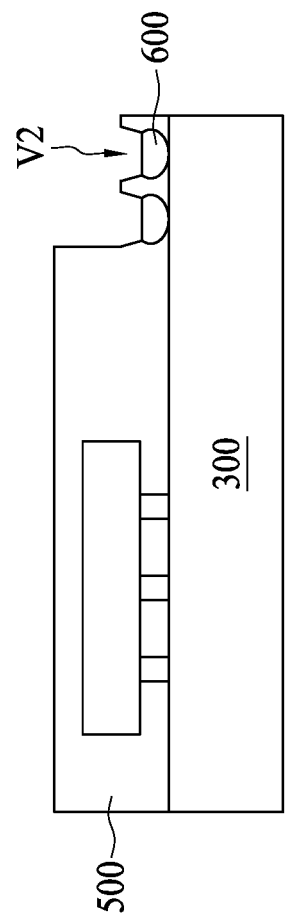

Referring to FIG. 7D, vias (or through mold vias, TMV) V2 are formed to expose the conductive elements 600. The vias V2 may be formed by any suitable operation such as a drilling operation or an etching operation.

Figure 7E:
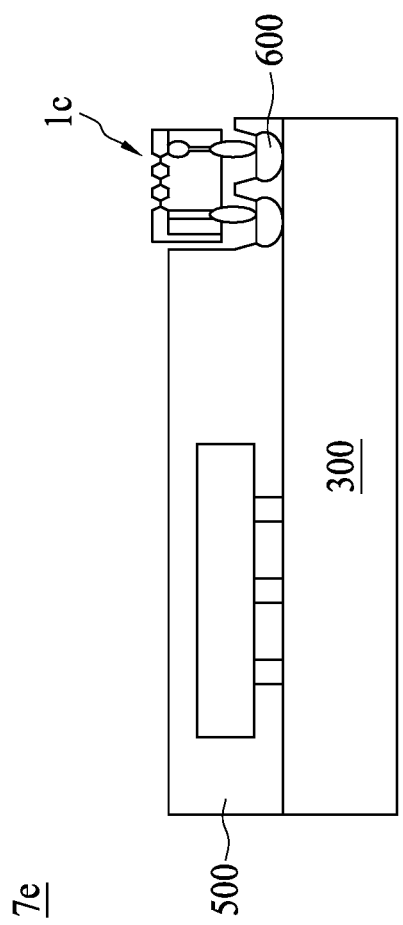

Referring to FIG. 7E, an antenna package 1c is disposed on the conductive elements 600. The antenna package 1c is the same as or similar to the antenna package 1c described in FIG. 3A. The antenna package 1c may be disposed by a surface mounting technology (SMT). The semiconductor package 7e is formed. The semiconductor package 7e may be the same as or similar to the semiconductor package 3a in FIG. 3A.

FIG. 8A, FIG. 8B, FIG. 8C, FIG. 8D and FIG. 8E are cross-sectional views of a semiconductor package 8e fabricated at various stages, in accordance with some embodiments of the present disclosure. Various figures have been simplified for a better understanding of the aspects of the present disclosure.

Figure 8A:
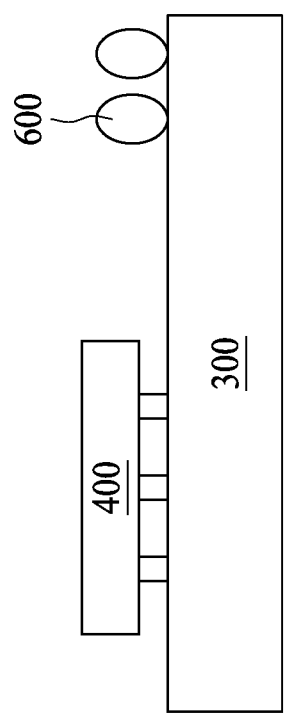
FIG. 8A, FIG. 8B, FIG. 8C, FIG. 8D and FIG. 8E are cross-sectional views of a semiconductor package fabricated at various stages, in accordance with some embodiments of the present disclosure.

Referring to FIG. 8A, a substrate 300 is provided. A semiconductor die 400 is mounted on the substrate 300. The semiconductor die 400 may be mounted by a flip chip bonding operation, a die bonding operation or a DAF bonding operation. Conductive elements 600 are disposed on the substrate 300 to be electrically connected to the substrate 300. The conductive elements 600 may include solder and may be disposed by a ball mount operation.

Figure 8B:
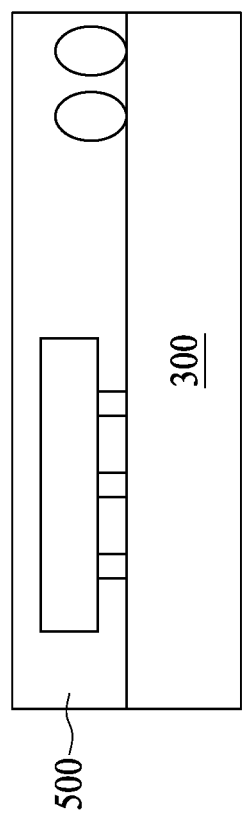

Referring to FIG. 8B, a package body 500 is formed on the substrate 300 to cover the semiconductor die 400 and the conductive elements 600. The package body 500 may be formed by a molding operation.

Figure 8C:
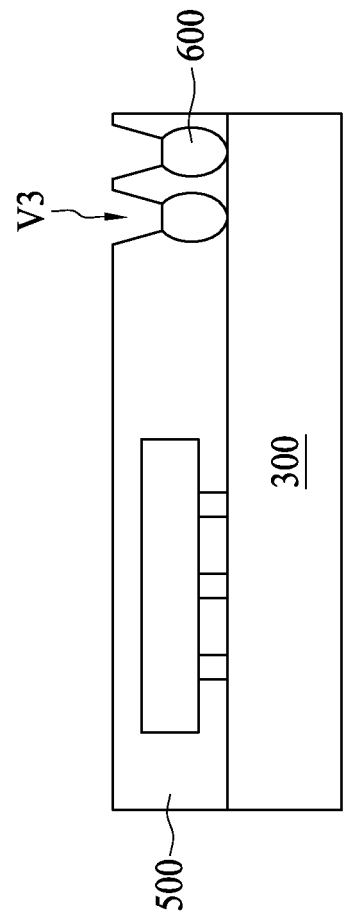

Referring to FIG. 8C, vias (or through mold vias, TMV) V3 are formed in the package body 500 to expose the conductive elements 600. The vias V3 may be formed by any suitable operation such as a drilling operation or an etching operation.

Figure 8D:
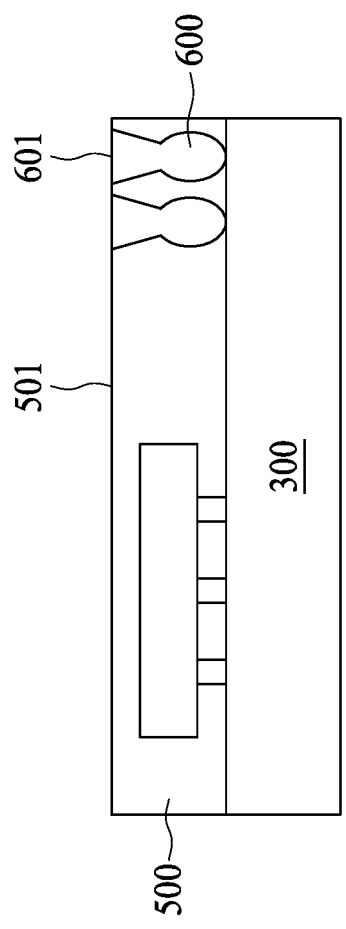

Referring to FIG. 8D, the vias V3 are filled with the conductive elements 600. The filling operation may be performed by a pre-solder operation. The filling operation may include a reflow operation. A surface 601 of the conductive elements 600 may be coplanar with a surface 501 of the package body 500.

Figure 8E:
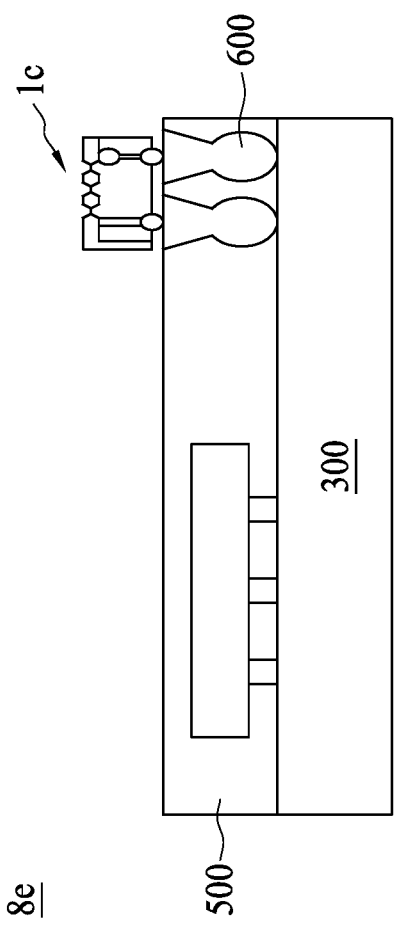

Referring to FIG. 8E, an antenna package 1c is disposed on the conductive elements 600. The antenna package 1c is the same as or similar to the antenna package 1c described in FIG. 3A or FIG. 4A. The antenna package 1c may be disposed by an SMT operation. The semiconductor package 8e is formed. The semiconductor package 8e may be the same as or similar to the semiconductor package 4a in FIG. 4A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An antenna package, comprising:
   a patterned antenna structure comprising a first surface, a second surface opposite the first surface and a third surface extended between the first surface and the second surface; and an encapsulant disposed on the first surface of the patterned antenna structure, wherein the third surface of the patterned antenna structure comprises a first portion covered by the encapsulant and a second portion exposed from the encapsulant.

2. The antenna package of claim 1, wherein the patterned antenna structure is a metal plate.

3. The antenna package of claim 1, wherein the third surface of the patterned antenna structure defines a space exposing the encapsulant.

4. The antenna package of claim 3, wherein a ratio of a width of the space to a thickness of the patterned antenna structure is less than 1.

5. The antenna package of claim 3, wherein the space comprises a first portion defined by the first portion of the third surface of the patterned antenna structure and a second portion defined by the second portion of the third surface of the patterned antenna structure.

6. The antenna package of claim 5, wherein a ratio of a depth of the first portion of the space to a thickness of the patterned antenna structure is greater than 0 and less than 0.5.

7. The antenna package of claim 1, further comprising an electrical contact on the encapsulant, and a conductive element within the encapsulant and electrically connecting the electrical contact and the patterned antenna structure.

8. The antenna package of claim 1, wherein the patterned antenna structure comprises an extended portion extending along a sidewall of the encapsulant.

9. The antenna package of claim 8, wherein the extended portion of the patterned antenna structure is inclined toward the encapsulant.

10. The antenna package of claim 8, wherein the extended portion of the patterned antenna structure comprises an antenna pattern.

11. A semiconductor package, comprising:
a substrate;
a semiconductor die on the substrate and electrically connected to the substrate; and
an antenna package disposed on the substrate and electrically connected to the substrate, the antenna package comprising:
an encapsulant; and
a patterned antenna structure on the encapsulant,
wherein the patterned antenna structure of the antenna package comprises a metal extension part extending between the encapsulant of the antenna package and the semiconductor die.

12. The semiconductor package of claim 11, further comprising a conductive element electrically connecting the antenna package and the substrate.

13. The semiconductor package of claim 11, further comprising a package body on the substrate and covering the semiconductor die.

14. The semiconductor package of claim 13, wherein the patterned antenna structure of the antenna package is exposed from the package body.

15. The semiconductor package of claim 13, wherein the antenna package is disposed in a recess recessed from a surface of the package body, the surface of the package body facing away from the substrate, and the metal extension part comprises a shielding layer.

16. The semiconductor package of claim 13, wherein the antenna package is disposed on a surface of the package body, the surface of the package body facing away from the substrate, and the metal extension part comprises an antenna pattern.

17. A method of manufacturing an antenna package, comprising:
providing a metal plate having a first surface and a second surface opposite to the first surface;
forming a first patterned recess on the first surface of the metal plate;
forming an encapsulant on the first surface of the metal plate and into the first patterned recess; and
forming a second patterned recess on the second surface of the metal plate and connecting to the first patterned recess to define a first antenna pattern, wherein the first antenna pattern protrudes into the encapsulant in a direction away from the second surface of the metal plate.

18. The method of claim 17, wherein a depth of the first patterned recess is less than half of a thickness of the metal plate.

19. The method of claim 17, wherein a sidewall of the first antenna pattern has a first portion covered by the encapsulant and a second portion exposed from the encapsulant.

20. The method of claim 17, further comprising bending an extended portion of the metal plate towards a sidewall of the encapsulant.

21. The method of claim 20, further comprising forming a second antenna pattern on the extended portion of the metal plate.

* * * * *